United States Patent
Yen et al.

(10) Patent No.: US 11,830,798 B2
(45) Date of Patent: Nov. 28, 2023

(54) SEMICONDUCTOR DEVICE PACKAGE

(71) Applicant: Advanced Semiconductor Engineering, Inc., Kaohsiung (TW)

(72) Inventors: You-Lung Yen, Taoyuan (TW); Bernd Karl Appelt, Holly Springs, NC (US)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 23 days.

(21) Appl. No.: 17/209,055

(22) Filed: Mar. 22, 2021

(65) Prior Publication Data

US 2022/0302008 A1    Sep. 22, 2022

(51) Int. Cl.
*H01L 23/538* (2006.01)
*H01L 23/498* (2006.01)
*H01L 23/00* (2006.01)

(52) U.S. Cl.
CPC .. *H01L 23/49833* (2013.01); *H01L 23/49816* (2013.01); *H01L 23/49838* (2013.01); *H01L 23/5385* (2013.01); *H01L 23/5386* (2013.01); *H01L 24/24* (2013.01); *H01L 24/25* (2013.01); *H01L 24/48* (2013.01); *H01L 24/49* (2013.01); *H01L 2224/244* (2013.01); *H01L 2224/24137* (2013.01); *H01L 2224/254* (2013.01); *H01L 2224/2505* (2013.01); *H01L 2224/25177* (2013.01); *H01L 2224/48101* (2013.01); *H01L 2224/48105* (2013.01); *H01L 2224/49105* (2013.01); *H01L 2224/49177* (2013.01)

(58) Field of Classification Search
CPC ....... H01L 23/538; H01L 24/29; H01L 24/30; H01L 24/32; H01L 24/33
See application file for complete search history.

(56) References Cited

U.S. PATENT DOCUMENTS

| | | | |
|---|---|---|---|
| 10,763,239 B2* | 9/2020 | Chen | H01L 24/19 |
| 2010/0200961 A1* | 8/2010 | Chauhan | H01L 23/481 |
| | | | 257/E21.597 |
| 2012/0074585 A1* | 3/2012 | Koo | H01L 23/147 |
| | | | 257/774 |
| 2015/0116968 A1* | 4/2015 | Yamada | H01L 23/49894 |
| | | | 361/767 |
| 2018/0204791 A1* | 7/2018 | Chen | H01L 25/0652 |
| 2019/0131273 A1* | 5/2019 | Chen | H01L 21/568 |
| 2020/0303328 A1* | 9/2020 | Braunisch | H01L 29/0657 |
| 2021/0225666 A1* | 7/2021 | Lin | H01L 21/6835 |
| 2021/0272929 A1* | 9/2021 | Tsai | H01L 24/82 |
| 2022/0020698 A1* | 1/2022 | Kim | H01L 23/3675 |

FOREIGN PATENT DOCUMENTS

CN    105374793 A    3/2016

* cited by examiner

*Primary Examiner* — Michele Fan
(74) *Attorney, Agent, or Firm* — FOLEY & LARDNER LLP

(57) ABSTRACT

The present disclosure provides a semiconductor device package. The semiconductor device package includes a substrate, a first module disposed on the substrate, a second module disposed on the substrate and spaced apart from the first module, and a conductive element disposed outside of the substrate and configured to provide a signal transmission path between the first module and the second module.

9 Claims, 6 Drawing Sheets

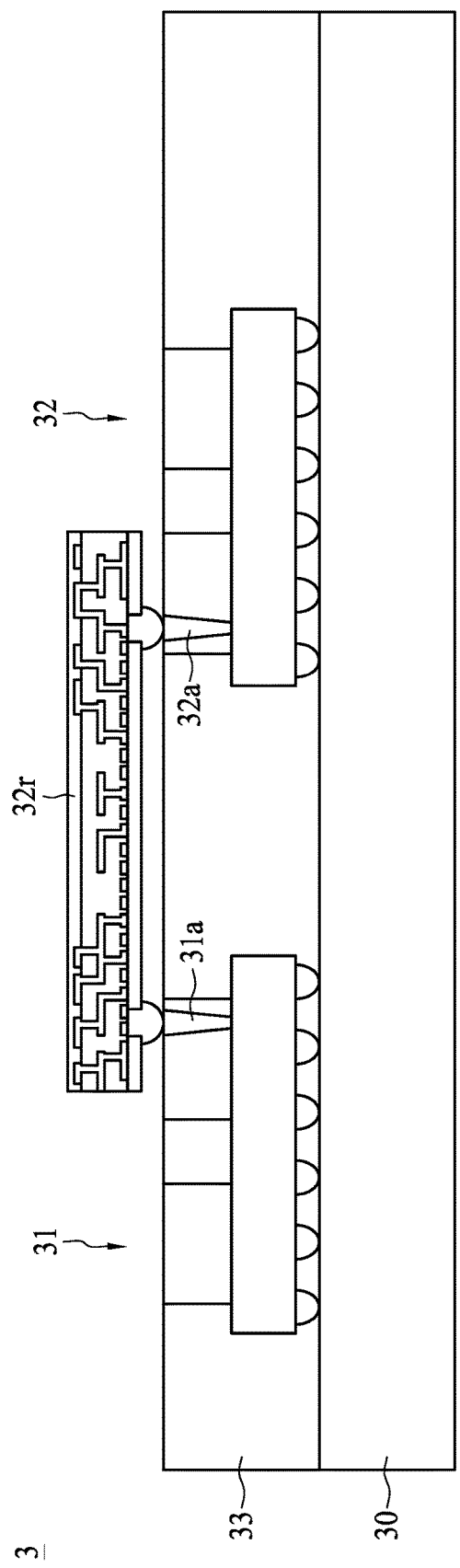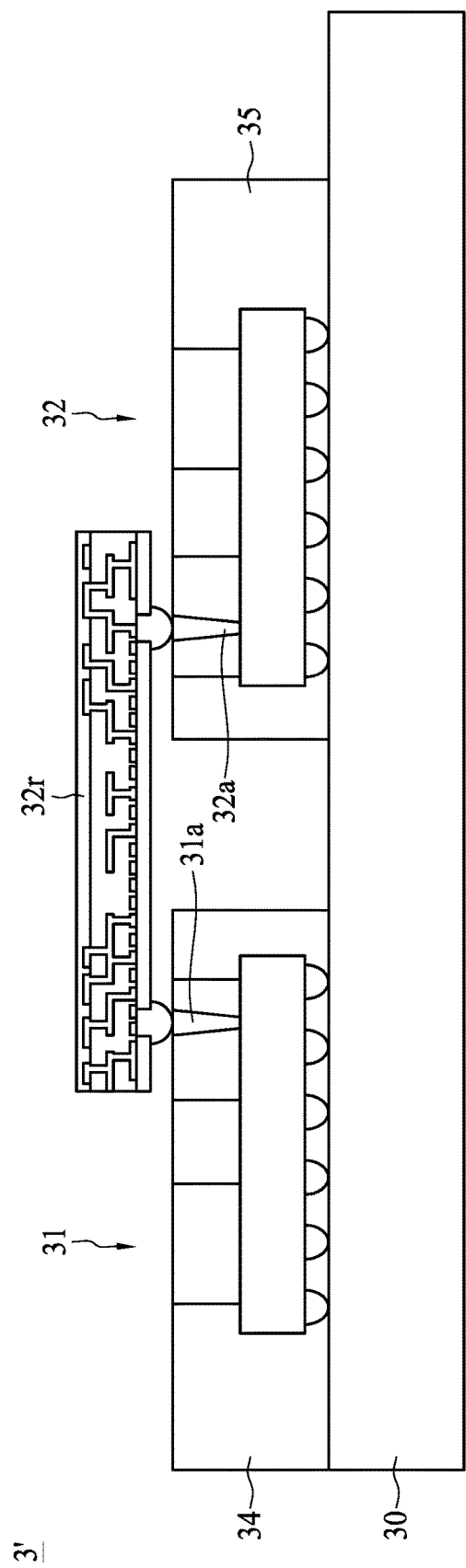
FIG. 3A
FIG. 3B

SEMICONDUCTOR DEVICE PACKAGE

BACKGROUND

1. Technical Field

The present disclosure generally relates to a semiconductor device package having an interposer.

2. Description of the Related Art

In 2.5D integrated circuit (IC) packaging technology, interposers (for example, Si interposers with Through Silicon Vias (TSVs)) are commonly used as interconnections to integrate electronic components of different pitch, but are limited by high cost and low yield.

In addition, the signal transmission path between the electronic components through the substrate may cause conduction loss and degrade the performance thereof.

SUMMARY

In some embodiments, a semiconductor device package includes a substrate, a first module disposed on the substrate, a second module disposed on the substrate and spaced apart from the first module, and a conductive element disposed outside of the substrate and configured to provide a signal transmission path between the first module and the second module.

In some embodiments, a semiconductor device package includes a signal bridgeable element and a plurality of electrical modules around the signal bridgeable element. The signal bridgeable element is configured to transmit a signal from a first electrical module to a second electrical module of the electrical modules.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 3A illustrates a cross sectional view of an exemplary semiconductor device package in accordance with some embodiments of the present disclosure.

FIG. 3B illustrates a cross sectional view of an exemplary semiconductor device package in accordance with some embodiments of the present disclosure.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1:
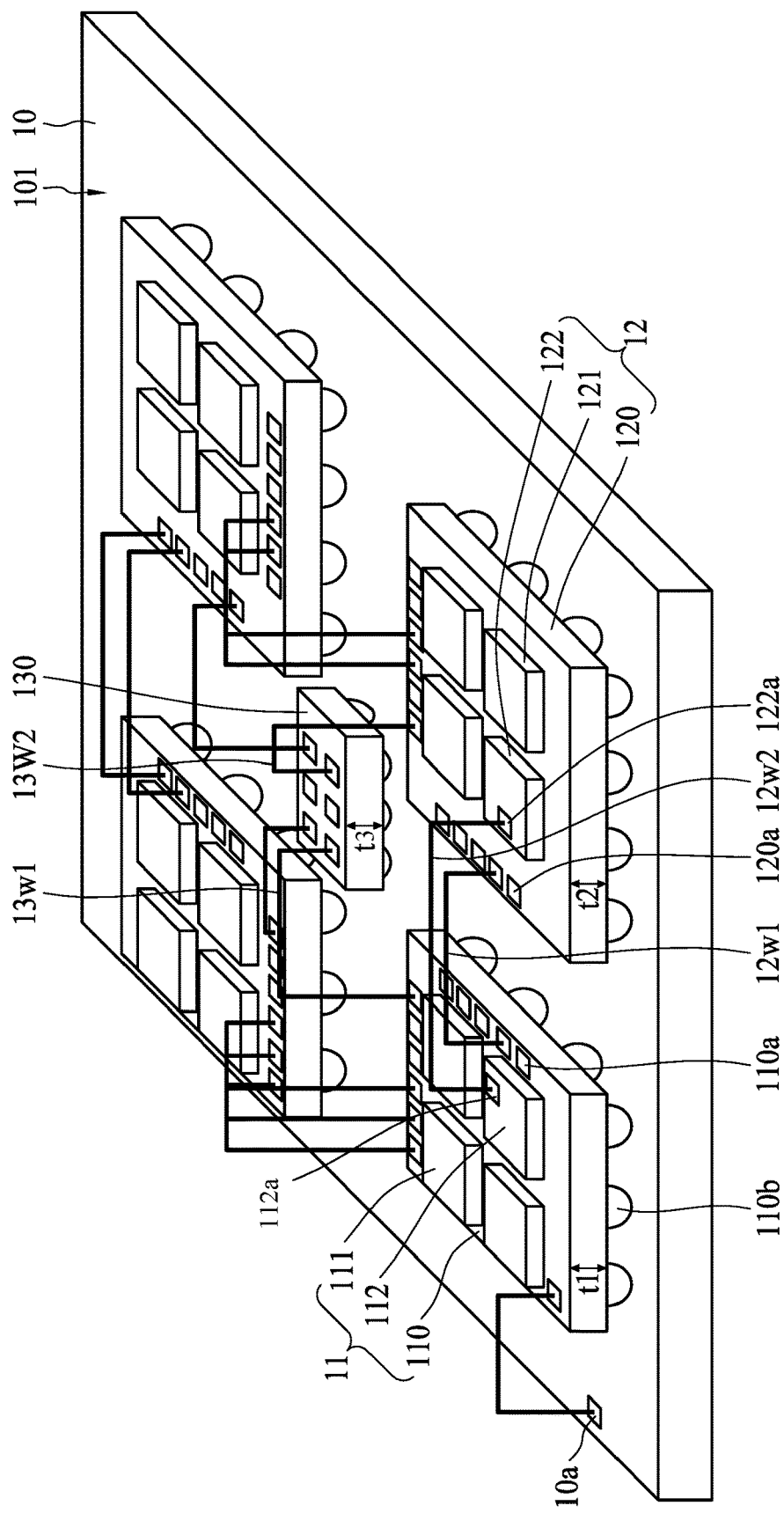
FIG. 1 illustrates a perspective view of an exemplary semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, a reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1 illustrates a perspective view of an exemplary semiconductor device package 1 in accordance with some embodiments of the present disclosure. In some arrangements, the semiconductor device package 1 includes a substrate 10, a plurality of modules (including modules 11 and 12, which can also be referred to as electrical modules), and an interposer 130.

In some embodiments, the substrate 10 may include, for example but is not limited to, a printed circuit board, such as a paper-based copper foil laminate, a composite copper foil laminate, and a polymer-impregnated glass-fiber-based copper foil laminate. In some embodiments, the substrate 10 may include one or more interconnection structures, such as a redistribution layer (RDL) or a grounding element. The interconnection structures may include one or more conductive pads (such as the conductive pad 10a) proximate to, adjacent to, or embedded in and exposed from a surface 101 of the substrate 10 for electrical connection with one or more electronic components, one or more of the modules, a ground, or a power supply. In some embodiments, the substrate 10 may also be referred to as a carrier.

The modules (including the modules 11 and 12) are disposed on the surface 101 of the substrate 10. The modules are discrete structures or components. For example, each of the modules is separated from another module. For example, each of the modules is spaced apart from another module.

The module 11 is laterally spaced from the module 12. The projected area of the module 11 on the surface 101 of the substrate 10 and the projected area of the module 12 on the surface 101 of the substrate 10 are not overlapped. In some embodiments, the projected area of the module 11 on the surface 101 of the substrate 10 may be greater than the projected area of the module 12 on the surface 101 of the substrate 10. In some embodiments, the projected area of the interposer 130 on the surface 101 of the substrate 10 may be smaller than the projected area of the module 11 on the surface 101 of the substrate 10. In some embodiments, the projected area of the interposer 130 on the surface 101 of the substrate 10 may be smaller than the projected area of the module 12 on the surface 101 of the substrate 10.

The module 11 includes an interposer 110 and one or more electronic components (such as the electronic components 111 and 112) disposed or installed on the interposer 110. Similarly, the module 12 includes an interposer 120 and one or more electronic components (such as the electronic components 121 and 122) disposed or installed on the interposer 120.

In some embodiments, the electronic components may be electrically connected to the interposers by, for example, flip-chip (such as using solder bumps) or wire-bonding.

The interposer 110 may be a part of the module 11 and the interposer 120 may be a part of the module 12. The interposer 110 may belong to the module 11 and the interposer 120 may belong to the module 12. The interposer 110 may be dedicated to the module 11 (for disposing the electronic components 111 and 112) and may not be shared with the electronic components 121 and 122. The interposer 120 may be dedicated to the module 12 (for disposing the electronic components 121 and 122) and may not be shared with the electronic components 111 and 112.

The one or more electronic components of the module 11 are spaced apart from the module 12. For example, the electronic components 111 and 112 are spaced apart from the interposer 120 of the module 12. For example, the projected area of the electronic component 111 on the surface 101 of the substrate 10 and the projected area of the interposer 120 on the surface 101 of the substrate 10 are not overlapped.

Similarly, the one or more electronic components of the module 12 are spaced apart from the module 11. For example, the electronic components 121 and 122 are spaced apart from the interposer 110 of the module 12. For example, the projected area of the electronic component 121 on the surface 101 of the substrate 10 and the projected area of the interposer 110 on the surface 101 of the substrate 10 are not overlapped.

The modules (including the modules 11 and 12) on the surface 101 of the substrate 10 may include function-oriented hybrid modules. For example, the plurality of modules may have different specification or characteristic such as function, operating frequency, bandwidth, signal type, impedance, line/space (L/S) width, or one or more combination thereof. For example, the module 11 may be for 4G application and the module 12 may be for 5G application.

In some embodiments, the electronic components may be classified or grouped based on the aforesaid specifications and integrated in separated or discrete modules on the substrate 10. For example, the electronic component 111 and the electronic component 121 may be different from each other in the aforesaid specifications. For example, the electronic components (e.g., the electronic components 111 and 112) having the same or similar function, operating frequency, bandwidth, signal type, impedance, and/or line/space (L/S) width may be grouped together as the module 11. For example, the electronic components (e.g., the electronic components 121 and 122) having the same or similar function, operating frequency, bandwidth, signal type, impedance, and/or line/space (L/S) width may be grouped together as the module 12.

In some embodiments, each of the electronic components (including the electronic components 111, 112, 121 and 122) may include a semiconductor substrate (e.g., silicon substrate), one or more integrated circuit (IC) devices, and one or more interconnection structures therein. In some examples, the IC devices may include an active component, such as an IC chip or a die. In some examples, the IC devices may include a passive electronic component, such as a capacitor, a resistor, or an inductor.

In some embodiments, each of the electronic components may include, for example but is not limited to, a packaged die (such as the electronic components 111 and 121) or a bare die (such as the electronic components 112 and 122). In some embodiments, each of the electronic components 111 and 121 may include a die embedded or encapsulated in a package body. In some embodiments, each of the electronic components 112 and 122 may include a die having exposed electrical contacts 112a and 122a.

In some embodiments, each of the interposers (including the interposers 110, 120, and 130) may include, for example but is not limited to, a printed circuit board, a circuitry, and a redistribution layer structure. In some embodiments, the interposer may include, for example but is not limited to, silicon (Si), glass or other suitable material. In some embodiments, the interposer may include one or more via extending between the opposite surfaces (e.g., between an upper surface and a lower surface) for electrical connection. For example, exposed conductive pads (not illustrated in the figures) on the surface 101 of the substrate 10 may be electrically connected with the one or more via of the interposers through the solder balls 110b.

In some embodiments, each of the interposers (including the interposers 110, 120, and 130) may include one or more conductive pads (such as the conductive pads 110a and 120a) for electrical connection. In some embodiments, the conductive pad may be arranged on a peripheral area of the interposer. For example, the conductive pad 110a of the interposer 110 is arranged on a portion of a peripheral area of the interposer 110 that adjacent to the interposer 120 for electrical connection with the interposer 120. The conductive pad 120a of the interposer 120 is arranged on a portion of a peripheral area of the interposer 120 that adjacent to the interposer 110 for electrical connection with the interposer 110. In some embodiments, a plurality of conductive pads may be arranged along a side of the interposer for electrical connection with another interposer.

In a comparative embodiment, a larger interposer having a fine L/S width may be used in order to support more electronic components of different die pad pitch, L/S width, and/or I/O count. However, using such an interposer may be costly and time consuming.

By comparison, in the present disclosure, the electronic components are classified into several groups based on different specifications or characteristics (such as function, operating frequency, bandwidth, signal type, impedance, line/space (L/S) width, other specifications, or one or more combinations thereof). Interposers with different specifications or characteristics (such as different L/S width) may be adopted to support different groups of electronic components, which reduces the cost and also reduces package size. Since the interposers are not shared among different groups of electronic components, the different groups form discrete modules.

In some embodiments, the L/S width of the interposer 110 may be different from the L/S width of the interposer 120. In some embodiments, for example, a dimension (such as the thickness t1) of the interposer 110 may be different from a dimension (such as the thickness t2) of the interposer 120. In some embodiments, the thickness t1 of the interposer 110 may be greater than the thickness t2 of the interposer 120. In some embodiments, the thickness t1 of the interposer 110 may be smaller than the thickness t2 of the interposer 120.

In some embodiments, the modules (including the modules 11 and 12) on the surface 101 of the substrate 10 may be electrically connected with each other through one or more conductive elements outside of the substrate 10. In other words, the modules may communicate through a signal transmission path without passing the substrate 10.

In some embodiments, a conductive wire (not shown for simplicity) may electrically connect an interposer (e.g. the interposer 110) with the substrate 10 or with an electronic component (e.g. the electronic component 111). In some embodiments, the modules may be electrically connected with each other through one or more conductive pads (e.g., the conductive pads 110a, 112a, 120a, and 122a), one or more conductive wires (e.g., the conductive wires 12w1, 12w2, 13w1, and 13w2), one or more interposers (e.g., the interposer 130), one or more redistribution structures (e.g., the redistribution structures 22r1, 22r2 and 23r illustrated in FIG. 2A), one or more conductive vias (e.g., the conductive vias 31a and 32a illustrated in FIG. 3A), one or more conductive pillars (e.g., the conductive pillar 43a illustrated in FIG. 4), other passive components, or a combination thereof.

For example, the conductive wire 12w1 may be connected between the conductive pad 110a of the interposer 110 of the module 11 and the conductive pad 120a of the interposer 120 of the module 12. The conductive wire 12w2 may be connected between the electrical contact 112a of the electronic component 112 of the module 11 and the electrical contact 122a of the electronic component 122 of the module 12. The conductive wire 13w1 may be connected between the conductive pad 110a of the interposer 110 of the module 11 and the conductive pad of the interposer 130. The conductive wire 13w2 may be connected between the conductive pad 120a of the interposer 120 of the module 12 and the conductive pad of the interposer 130.

In some embodiments, each of the conductive wires 12w1, 12w2, 13w1, and 13w2 may include, for example, gold (Au), silver (Ag), copper (Cu), nickel (Ni), palladium (Pd), another metal(s) or alloy(s), or a combination of two or more thereof. In some embodiments, each of the conductive wires 12w1, 12w2, 13w1, and 13w2 may include an enamel insulated wire. In some embodiments, each of the conductive wires 12w1, 12w2, 13w1, and 13w2 may be covered by an electrical insulation layer, such as a parylene coating. In some embodiments, the parylene coating may also cover the exposed surface of the modules 11 and 12 and the exposed surface 101 of the substrate 10. In some embodiments, the parylene coating may protect the modules 11 and 12 and the conductive wires 12w1, 12w2, 13w1, and 13w2. In some embodiments, using the parylene coating may be beneficial to heat dissipation in comparison with forming an encapsulating layer.

In some embodiments, since the modules may communicate through passive components (e.g., the conductive wires 12w1, 12w2, 13w1, or 13w2), the signals transmitted between the modules may remained unchanged during the transmission. For example, the signal transmitted by the module 11 to the module 12 through the conductive element outside of the substrate 10 is substantially the same as or similar to the signal received by the module 12. For example, the signal transmitted by the module 11 to the module 12 through the conductive element outside of the substrate 10 may have the same or similar information as the signal received by the module 12.

For example, the signal transmitted by the electronic component 112 through the conductive wire 12w2 to the electronic component 122 may remained unchanged during the transmission. For example, the signal transmitted by the electronic component 111 through the conductive wire 12w1 to the electronic component 121 may remained unchanged during the transmission. For example, the signal transmitted by the electronic component 111 through the conductive wires 13w1, 13w2 and the interposer 130 to the electronic component 121 may remained unchanged during the transmission.

In some embodiments, the interposer 130 may be connected to more than one modules on the substrate 10 and may function as a relay station for a long-distance signal transmission. In some embodiments, a dimension (such as the thickness t3) of the interposer 130 may be different from the thickness t1 of the interposer 110 and the thickness t2 of the interposer 120. In some embodiments, the thickness t3 of the interposer 130 may be greater than the thickness t1 of the interposer 110 and the thickness t2 of the interposer 120. In some embodiments, an electronic component (not illustrated in the figures) that communicates with more than one module may be on the interposer 130 and may function as a control center, which may help to further reduce the signal transmission distance. In some embodiments, the interposer 130 may also be referred to as a signal bridgeable element.

In some comparative embodiments, the modules can be communicated to each other through the substrate. For example, signal or data can be transmitted from an electronic component of a module to another electronic component of another module through the substrate. However, such long signal transmission path would increase the conduction loss and limit the transmission rate between the modules. According to the embodiments as shown in FIG. 1, the signal can be directly transmitted between two or more modules through the conductive wires 12w1, 12w2, 13w1, or 13w2 without passing through the substrate 10, which can reduce conduction loss in comparison with transmitting a signal through the substrate 10. Therefore, the present disclosure would improve electrical performance and reliability of the semiconductor device package 1.

Moreover, the wire-bonding connection of the present disclosure provides more flexibility when assembling the modules. Modules can be separated and arranged on any location on the substrate 10 to avoid signal interference without compromising package size.

Although the semiconductor device package 1 illustrated in FIG. 1 have specific structures and specific numbers of components, the present disclosure is not limited thereto. For examples, the locations, dimensions, orientations, and number of the modules, the electronic components, the interposers, and/or the conductive elements may be adjusted based on the design of the function, the cost, or other factors. Furthermore, each of the modules in the semiconductor device package 1 may have any number of packaged die and any number of bare die.

Figure 2A:
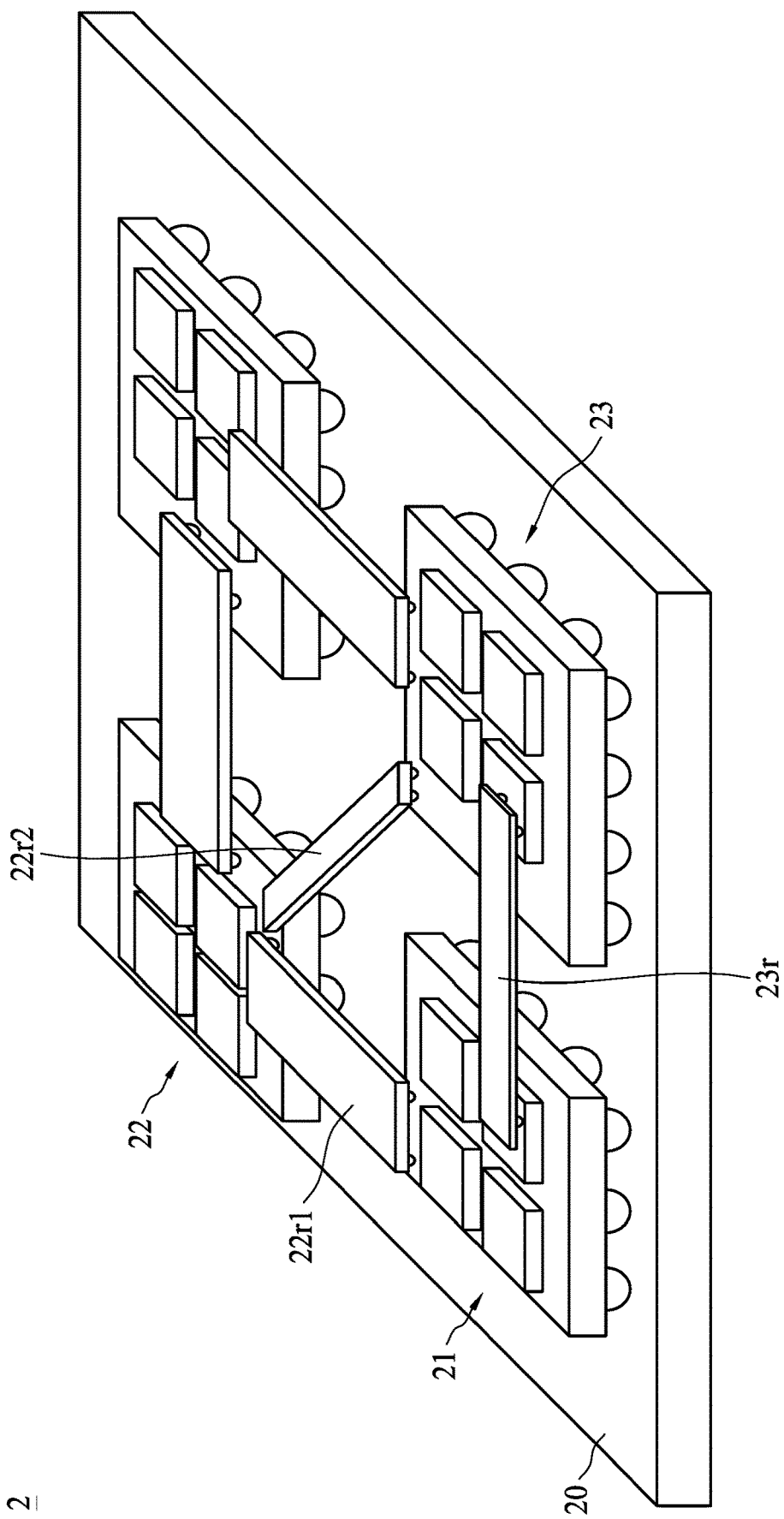
FIG. 2A illustrates a perspective view of an exemplary semiconductor device package in accordance with some embodiments of the present disclosure.

The semiconductor device package 2 in FIG. 2A is similar to the semiconductor device package 1 in FIG. 1 except for the differences described below.

The modules (including the modules 21, 22 and 23) are disposed on the substrate 20. Each of the modules includes one or more electronic components disposed on an interposer. The modules on the substrate 20 may be electrically connected with each other through the redistribution structures (including the redistribution structures 22r1, 22r2, and 23r). Each of the redistribution structures 22r1, 22r2, and 23r may provide a signal transmission path without passing the substrate 20.

For example, the redistribution structures 22r1 may be connected between the conductive pad of the interposer of the module 21 and the conductive pad of the interposer of the module 22. The redistribution structures 22r2 may be connected between the conductive pad of the interposer of the module 22 and the conductive pad of the interposer of the module 23. The redistribution structures 23r may be connected between the electrical contact of the electronic component of the module 21 and the electrical contact of the electronic component of the module 23.

In some embodiments, each of the redistribution structures 22r1, 22r2, and 23r may include a redistribution layer (RDL), a metal layer, a wiring structure, or another passive electronic component. In some embodiments, the signals transmitted between the modules may remained unchanged during the transmission.

In some embodiments, the redistribution structures 22r1, 22r2, and 23r may provide high-speed signal propagation. In some embodiments, the electrical connections between modules may use both the redistribution structures and the conductive wires based on functional design, cost, or other factors.

Figure 2B:
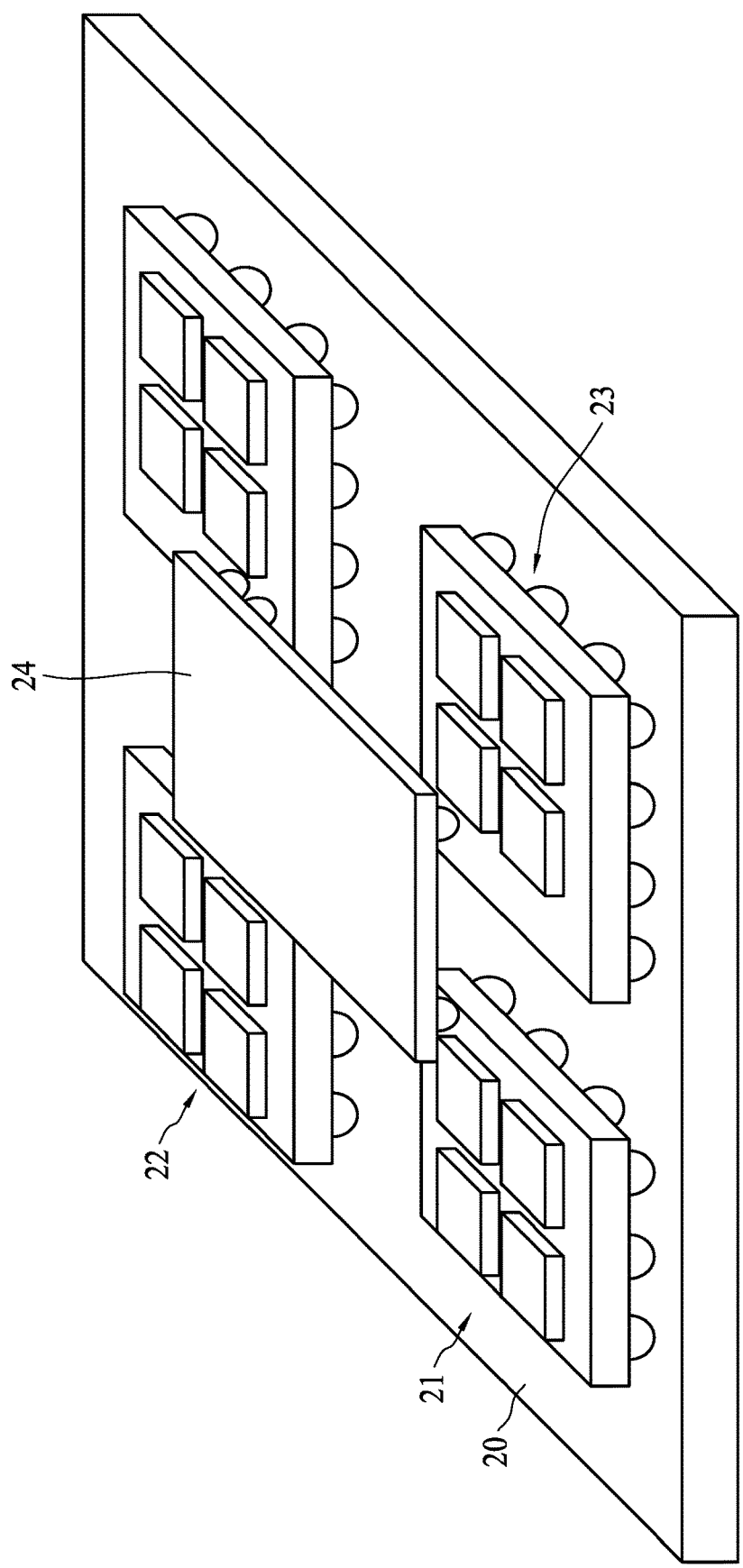
FIG. 2B illustrates a perspective view of an exemplary semiconductor device package in accordance with some embodiments of the present disclosure.

The semiconductor device package 2' in FIG. 2B is similar to the semiconductor device package 2 in FIG. 2A except for the differences described below.

The modules (including the modules 21, 22 and 23) on the substrate 20 may be electrically connected with each other through the redistribution structure 24. In some embodiments, a portion of the redistribution structure 24 may be connected between the conductive pad of the interposer of the module 21 and the conductive pad of the interposer of the module 22. Another portion of the redistribution structure 24 may be connected between the conductive pad of the interposer of the module 22 and the conductive pad of the interposer of the module 23. Yet another portion of the redistribution structure 24 may be connected between the conductive pad of the interposer of the module 21 and the conductive pad of the interposer of the module 23.

In some embodiments, the redistribution structure 24 may provide high-speed signal propagation. In some embodiments, the manufacturing cost of the redistribution structure 24 may be further reduced in comparison with the separating redistribution structures 22r1, 22r2, and 23r.

The semiconductor device package 3 in FIG. 3A is similar to the semiconductor device package 2 in FIG. 2A except for the differences described below.

The encapsulating layer 33 is formed on the substrate 30 to cover the electronic component and the interposer of the module 31 and the electronic component and the interposer of the module 32. The redistribution structure 32r is disposed on the encapsulating layer 33. The redistribution structure 32r is electrically connected between the conductive via 31a of the electronic component of the module 31 and the conductive via 32a of the electronic component of the module 32. In some embodiments, the encapsulating layer 33 may include, for example, an epoxy resin having fillers, a molding compound (e.g., an epoxy molding compound or other molding compound), a polyimide, a phenolic compound or material, a material with a silicone dispersed therein, or a combination thereof.

In some embodiments, the encapsulating layer 33 may help to further reduce the total package height of the semiconductor device package 3.

In some embodiments, the redistribution structure 32r may be laterally disposed between the module 32 and the module 32. For example, the redistribution structure 32r may be electrically connected between the conductive pad of the interposer of the module 31 and the conductive pad of the interposer of the module 32.

In some embodiments, the redistribution structure 32r may be covered by the encapsulating layer 33.

The semiconductor device package 3' in FIG. 3B is similar to the semiconductor device package 3 in FIG. 3A except for the differences described below.

The encapsulating layer 34 is formed on the substrate 30 to cover the electronic component and the interposer of the module 31. The encapsulating layer 35 is formed on the substrate 30 to cover the electronic component and the interposer of the module 32. The encapsulating layer 34 is spaced apart from the encapsulating layer 35.

Figure 3C:
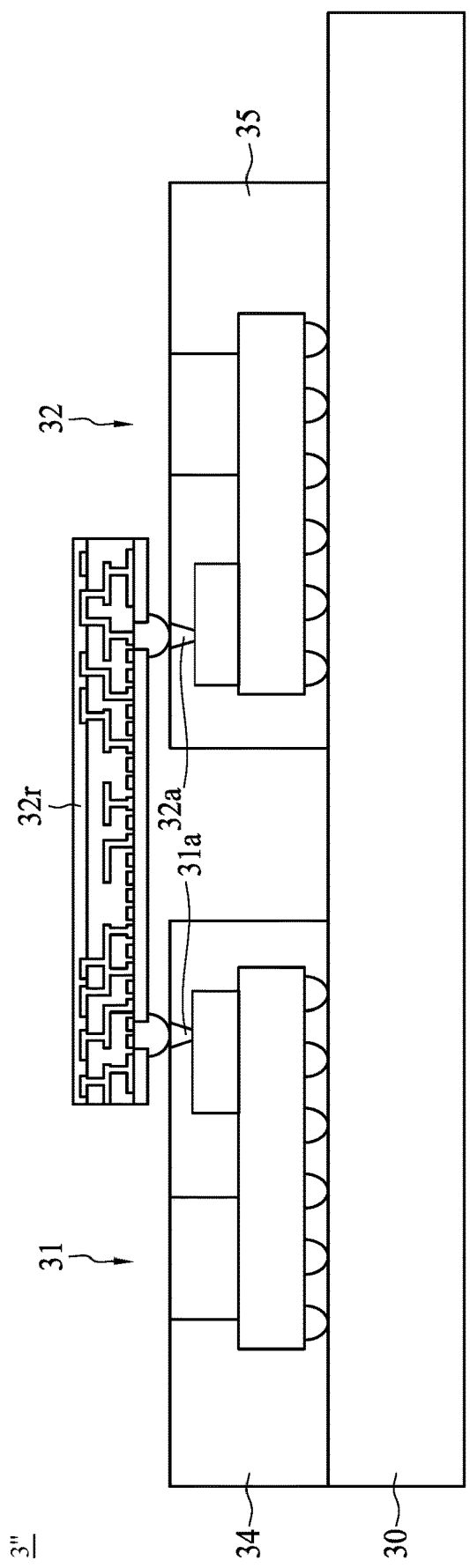
FIG. 3C illustrates a cross sectional view of an exemplary semiconductor device package in accordance with some embodiments of the present disclosure.

The semiconductor device package 3" in FIG. 3C is similar to the semiconductor device package 3' in FIG. 3B except for the differences described below.

In FIG. 3B, each of the conductive via 31a and the conductive via 32a may penetrate through the corresponding electrical component (which may be a bare die). In some embodiments, each of the conductive via 31a and the conductive via 32a may also penetrate through the encapsulating layer 33. Each of the conductive via 31a and the conductive via 32a may be connected with an active surface (facing-down) of the corresponding electrical component.

In FIG. 3C, each of the conductive via 31a and the conductive via 32a may penetrate through the encapsulating layer 33. Each of the conductive via 31a and the conductive via 32a may be connected with an active surface (facing-up) of the corresponding electrical component (which may be a bare die).

Figure 4:
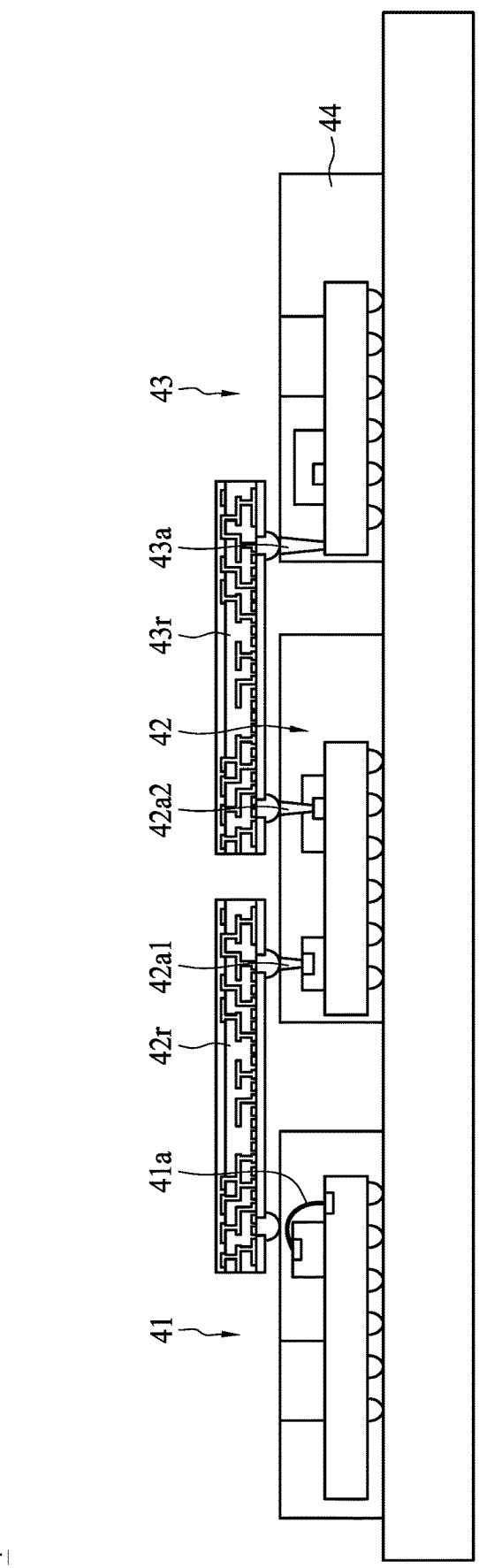
FIG. 4 illustrates a cross sectional view of an exemplary semiconductor device package in accordance with some embodiments of the present disclosure.

The semiconductor device package 4 in FIG. 4 is similar to the semiconductor device package 3' in FIG. 3B except for the differences described below.

The conductive wire 41a is connected with an active surface of the electrical component (which may be a bare die) of the module 41. The conductive wire 41a is encapsulated in the encapsulating layer covering the module 41 and at least a part of the conductive wire 41a is exposed from the encapsulating layer covering the module 41.

The conductive via 42a1 is connected with an active surface (facing-up) of the electrical component (which may be a bare die) of the module 42. The conductive via 42a1 is encapsulated in the encapsulating layer covering the module 42 and at least a part of the conductive via 42a1 is exposed from the encapsulating layer covering the module 42.

The conductive via 42a2 is connected with an active surface (facing-down) of the electrical component (which may be a bare die) of the module 42. The conductive via 42a2 is encapsulated in the encapsulating layer covering the module 42 and at least a part of the conductive via 42a2 is exposed from the encapsulating layer covering the module 42.

The conductive pillar 43a penetrates through the encapsulating layer 44 covering the module 43. The conductive pillar 43a is connected with an active surface (facing-down) of the electrical component (which may be a bare die) of the module 43.

The redistribution structure 42r is connected between the conductive wire 41a and the conductive via 42a1. The redistribution structure 43r is connected between the conductive via 42a1 and the conductive pillar 43a.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
   a substrate;
   a first module disposed on the substrate, wherein the first module comprises an first interposer disposed over the substrate, a first electronic component disposed over the first interposer, and a first conductive via penetrating through the first electronic component;
   a second module disposed on the substrate and spaced apart from the first module;
   a first conductive element disposed outside of the substrate and configured to provide a signal transmission path between the first module and the second module; and
   a first encapsulating layer encapsulating the first module, wherein the first conductive via penetrates through the first encapsulating layer,
   wherein the first module is disposed between the substrate and the first conductive element,
   and wherein the first conductive element is electrically connected to the first electronic component through the first conductive via.

2. The semiconductor device package of claim 1, further comprising:
   a third module disposed over the substrate;
   a second conductive element disposed over the second module and the third module, wherein the second conductive element is disposed farther from the substrate with respect to the second module and the third module, and wherein the second conductive element is configured to provide a signal transmission path between the second module and the third module; and
   a third conductive element disposed over the first module and the third module, wherein the third conductive element is disposed farther from the substrate with respect to the first module and the third module, and wherein the third conductive element is configured to provide a signal transmission path between the first module and the third module,
   wherein the first conductive element, the second conductive element, and the third conductive element are spaced apart from each other.

3. The semiconductor device package of claim 1, wherein the first encapsulating layer encapsulates the first electronic component and a lateral surface of the first interposer of the first module, and the first encapsulating layer is in contact with the substrate.

4. The semiconductor device package of claim 3, wherein a part of the first encapsulating layer is disposed between the first interposer of the first module and the substrate.

5. The semiconductor device package of claim 3, wherein the second module comprises an second interposer disposed over the substrate, a second electronic component disposed over the second interposer, and a second conductive via penetrating through the second electronic component, wherein the first conductive element crosses the first electronic component and the second electronic component, and wherein the first conductive element is electrically connected to the second electronic component through the second conductive via.

6. The semiconductor device package of claim 5, further comprising:
   a second encapsulating layer encapsulating the second module and contacting the substrate, wherein the second encapsulating layer is spaced apart from the first encapsulating layer, and wherein a part of an upper surface of the substrate is exposed by the second encapsulating layer.

7. The semiconductor device package of claim 6, wherein the first encapsulating layer comprises a first lateral surface substantially coplanar with a lateral surface of the substrate.

8. The semiconductor device package of claim 7, wherein first encapsulating layer comprises a second lateral surface opposite to the first lateral surface, and the second lateral surface is spaced apart from the second encapsulating layer.

9. The semiconductor device package of claim 1,
   wherein the first interposer comprises a conductive pad non-overlapped with respect to the first electronic component in a direction substantially perpendicular to a surface of the substrate;
   wherein the conductive pad is over a surface of the first interposer facing away from the substrate and in contact with the first conductive element; and
   wherein a projected area of the first module on the substrate is greater than a projected area of the second module on the substrate.

* * * * *